(12) United States Patent
Chino

(10) Patent No.: US 6,613,679 B2
(45) Date of Patent: Sep. 2, 2003

(54) METHOD FOR FABRICATING A SEMICONDUCTOR DEVICE

(75) Inventor: Toyoji Chino, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/741,090

(22) Filed: Dec. 21, 2000

(65) Prior Publication Data

US 2002/0009894 A1 Jan. 24, 2002

(30) Foreign Application Priority Data

Dec. 22, 1999 (JP) .......................................... 11-364662

(51) Int. Cl.[7] .......................................... H01L 21/311
(52) U.S. Cl. ...................... 438/700; 438/714; 438/718; 438/752
(58) Field of Search ............................. 438/31, 32, 40, 438/41, 681, 700, 706, 713, 714, 718, 745, 752; 257/13, 461, 466, 95, 97, 45–50

(56) References Cited

U.S. PATENT DOCUMENTS

| 4,809,287 A | * | 2/1989 | Ohba et al. ................... 372/45 |
| 4,994,143 A | * | 2/1991 | Kim ............................ 156/649 |
| 5,242,536 A | * | 9/1993 | Schoenborn ................. 156/643 |
| 5,336,365 A | * | 8/1994 | Goda et al. .................. 156/643 |
| 5,568,501 A | | 10/1996 | Otsuka et al. |
| 5,665,203 A | * | 9/1997 | Lee et al. .................... 438/712 |
| 6,052,397 A | * | 4/2000 | Jeon et al. ................... 372/46 |
| 6,104,738 A | | 8/2000 | Kitoh et al. |

FOREIGN PATENT DOCUMENTS

| JP | 08-051255 | 2/1996 |
| WO | WO 97/24787 | 7/1997 |

OTHER PUBLICATIONS

Wolf et al., Silicon Processing for the VLSI Era, vol. 1, 1986, pp. 539, 554, 555.*
Y. Suematsu, "Semiconductor Laser Diode and Optical Integrated Circuit", A book published by Ohmsha, pp. 429–436, 1984.

* cited by examiner

Primary Examiner—Benjamin L. Utech
Assistant Examiner—Duy-Vu Deo
(74) Attorney, Agent, or Firm—Nixon Peabody LLP; Donald R. Studebaker

(57) ABSTRACT

A method for fabricating a semiconductor device of the present invention comprises the steps of: a) depositing a masking film on a first compound semiconductor layer formed on a semiconductor substrate; b) patterning the masking film so that the film has an opening; c) etching away at least an uppermost part of the first semiconductor layer, which part is located inside the opening and includes a degraded layer formed in the step a) or b), using a first etchant and the masking film; and d) patterning the first semiconductor layer by etching away another part of the first layer using a second etchant and the masking film. That another part is located inside the opening and does not include the uppermost part with the degraded layer. The second etchant allows for etching the first layer at a rate lower than a rate realized by the first etchant.

9 Claims, 8 Drawing Sheets

METHOD FOR FABRICATING A SEMICONDUCTOR DEVICE

BACKGROUND OF THE INVENTION

The present invention generally relates to a method for fabricating a semiconductor device including a compound semiconductor layer, and more particularly relates to increasing the yield of the device.

In recent years, research and development has been carried on vigorously to further reduce the costs of semiconductor laser modules. First of all, reducing the fabrication costs of semiconductor laser chips for use in the laser modules is effective in attaining such an object. Minimizing variation in the width of a striped active layer is one of effective means for cutting down on the fabrication costs of the laser chips. This is because difference in characteristics of the laser chips can be reduced, and the yield increases. As a result, the manufacturing costs of the laser chips can be cut down.

Reducing the divergence angle of a beam emitted from a semiconductor laser diode is effective in further lowering the fabrication costs of the laser modules. With a laser diode emitting a beam with a reduced divergence angle, the laser diode can be connected to an optical fiber directly without using a lens. Thus, the number of components required can be decreased.

If a semiconductor laser diode, emitting a beam with a broad divergence angle, should be connected to an optical fiber by way of a lens, the laser beam has to be guided to the core of the fiber accurately. For that purpose, the diode and the fiber need to be aligned with each other so that the beam is guided to the fiber most efficiently while being emitted from the diode. That is to say, active alignment should be performed. However, the active alignment needs high precision, expensive equipment and yet it takes much trouble and time to connect the diode to the fiber. Therefore, the cost of fabricating the module gets much higher.

In contrast, if the divergence angle of a beam emitted from a semiconductor laser diode is reduced, a lens does not have to be used. Accordingly, by aligning the diode and the fiber with each other mechanically, the diode can be connected to an optical fiber so that the laser beam is guided to the fiber efficiently. That is to say, passive alignment is performed in that situation. The passive alignment only needs equipment that aligns the diode and the fiber mechanically and precisely. Also, it does not take so much time to connect the diode to the fiber. Therefore, the fabrication cost of the laser module can be lowered. Several techniques of reducing the divergence angle of a beam emitted from a laser diode have been suggested. One of those techniques is making the diameter of the beam, emitted from the diode, 1 µm or less by shaping a striped active layer of the diode in such a manner that the layer has a tapered cross section.

As described above, it can be seen that precise control over the width of a striped active layer changes the resultant characteristic of a semiconductor laser diode being fabricated and the cost of fabricating a semiconductor laser module significantly.

A known technique of forming a striped active layer made of compound semiconductors containing indium (In), phosphorus (P), gallium (Ga) and arsenic (As), for instance, is described in detail, e.g., in "Semiconductor Laser Diode and Optical Integrated Circuit" (Yasuharu Suematsu, published by Ohmsha, pp.429–436, 1984). According to the technique described in this document, a multilayer structure, made up of at least InGaAsP and InP layers, is etched to a reversed taper shape. Specifically, the InGaAsP and InP layers are deposited in this order over an InP substrate by crystal growth. Then, the etching is performed using a mixture of bromine and methanol (which will be herein called $Br_2$/$CH_3OH$ mixture), as a non-selective etchant against the InGaAsP and InP layers. In this process step, a silicon dioxide ($SiO_2$) film is used as a mask. The next step is selectively etching only the InP layer utilizing a mixture of hydrochloric acid and water (which will be herein called HCl/$H_2O$ mixture). By making use of this technique, it is possible to form a striped active layer extending in the [100] direction so that its side faces cross the substrate substantially at right angles on a cross section.

In this technique, however, the width of the striped active layer is adjusted by controlling the etch time. Therefore, if the diameter of the InP substrate is increased to form a greater number of semiconductor laser chips on the same substrate, the width of the striped active layer is likely to vary on the order of sub-microns within the same substrate and among substrates. As a result, the yield of the laser chips adversely decreases and the costs of fabricating the laser modules rise.

SUMMARY OF THE INVENTION

It is therefore an object of the present invention to reduce the variation in etch rate of a compound semiconductor layer.

An inventive method for fabricating a semiconductor device with a compound semiconductor layer includes the steps of: a) depositing a masking film on a first compound semiconductor layer formed on a semiconductor substrate; b) patterning the masking film so that the film has an opening; c) etching away at least an uppermost part of the first semiconductor layer, which part is located inside the opening and includes a degraded layer formed in the step a) or b), using a first etchant and the masking film; and d) patterning the first semiconductor layer by etching away another part of the first layer using a second etchant and the masking film. Said another part is located inside the opening and does not include the uppermost part with the degraded layer. The second etchant allows for etching the first layer at a rate lower than a rate realized by the first etchant.

The uppermost part of the first semiconductor layer with the degraded layer, which has been formed in the step a) or b) and is located inside the opening, is etched away using the first etchant and the masking film. Accordingly, when another part of the first semiconductor layer other than the uppermost part is removed using the second etchant, there is no need to etch the degraded layer anymore. Therefore, the variation in etching start time of the first semiconductor layer can be reduced in the step d). As a result, the variation in etch rate on the same substrate or among substrates can be reduced in the step d). That is to say, the variation in etch rate of the remaining first semiconductor layer can be reduced.

In the step b), the masking film is preferably patterned by a dry etching process.

By performing the dry etching process, the opening of the masking film can be patterned precisely.

The degraded layer includes at least one of: a damaged layer that has a composition deviated from a stoichiometric composition of elements in the first semiconductor layer; an oxide layer of the first semiconductor layer; and a reactant layer formed through a reaction of the first semiconductor layer with a reactive gas for use in the dry etching process.

In the step a), an uppermost part of the substrate may be a second compound semiconductor layer. And the method may further include the step of patterning the second semiconductor layer using a remaining part of the first semiconductor layer as a mask after the first layer has been patterned in the step d).

Another inventive method for fabricating a semiconductor device with a compound semiconductor layer includes the steps of: a) depositing a masking film on a compound semiconductor layer formed on a semiconductor substrate; b) patterning the masking film so that the film has an opening; c) removing a first part of the semiconductor layer to a predetermined point by a dry etching process using the masking film; and d) etching away at least a second part of the semiconductor layer using a first etchant and the masking film. The first part is located inside the opening and the second part includes a degraded layer formed in the step c).

The first part of the semiconductor layer is patterned by the dry etching process using the masking film. And then the degraded layer is removed using the first etchant. In this manner, the degraded layer formed by the dry etching process can be eliminated from the semiconductor device, and then the remaining semiconductor layer can be patterned into a desired shape precisely.

In the step a), the semiconductor layer is made up of first and second compound semiconductor layers that have been stacked in this order on the substrate. In the step c), the first part of the first semiconductor layer is removed. In the step d), at least the second parts of the first and second semiconductor layers are etched away using the first etchant and the masking film. And the method may further include the step of e) patterning the first semiconductor layer by removing a third part of the first semiconductor layer using a second etchant and the masking film. The third part is located inside the opening and does not include the second part. The second etchant allows for etching the first semiconductor layer at a rate lower than a rate realized by the first etchant.

The degraded layer, which has been formed in the second parts of the first and second semiconductor layers as a result of the step c), is etched away using the first etchant in the step d). Therefore, there is no need to etch the degraded layer anymore in the step e). For that reason, the variation in etching start time of the second semiconductor layer can be reduced. As a result, the variation in etch rate on the same substrate or among substrates can be reduced in the step e). That is to say, the variation in etch rate of the remaining second semiconductor layer can be minimized.

DESCRIPTION OF THE PREFERRED EMBODIMENTS

Figure 1A:
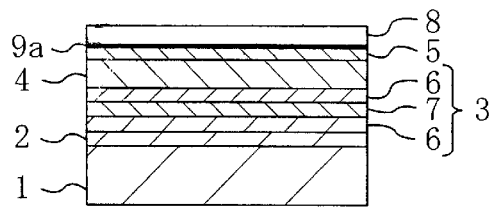
FIGS. 1A through 1E schematically illustrate cross-sectional structures corresponding to respective steps of a process of fabricating a semiconductor laser chip according to a first embodiment of the present invention.

If the diameter of an InP substrate is increased to obtain a greater number of semiconductor laser chips from the single InP substrate, the width of a striped active layer is likely to vary on the order of sub-microns within the same substrate and among substrates. The present inventors found the cause of this variation as follows.

According a known method for fabricating the laser chips, an $SiO_2$ film is formed by a plasma CVD or thermal CVD process. Therefore, a portion of a compound semiconductor layer near the surface is altered into a degraded layer due to the damage caused by plasma or heat. Also, if an $SiO_2$ film is changed into a predetermined shape by a dry etching process, a portion of a compound semiconductor layer near the surface is altered by an etching gas into a degraded layer. As used herein, "degraded layer" means a layer different from a desired compound semiconductor layer. Specifically, "the degraded layer" includes: a damaged layer with a composition that deviates from stoichiometry (i.e., non-stoichiometric layer); an oxide layer resulting from reaction with oxygen within an ambient; and a reactant layer resulting from reaction with an etchant gas, for example.

In the known technique, wet etching is performed without removing the degraded layer. The degraded layer has non-uniform thickness and composition over the substrate, and etching of a compound semiconductor layer does not start at the same time everywhere. Therefore, the etch rate becomes non-uniform even on the same substrate and also differs among substrates. Wet etching is isotropic, so etching of the compound semiconductor layer also progresses horizontally. Therefore, if etching does not start at the same time everywhere, the etch rate changes horizontally, too. As a result, variation in the width of a striped active layer is brought about on the same substrate and among substrates. The following embodiments 1 through 3 were realized based on these findings.

Hereinafter, preferred embodiments of a method for fabricating a semiconductor device according to the present invention will be described with reference to FIGS. 1A through 7E. In the drawings, the same components are identified by the same reference numerals for the sake of simplicity.

Embodiment 1

FIGS. 1A through 1E illustrate cross-sectional structures of corresponding to respective steps of a process of fabricating a semiconductor laser chip according to a first embodiment of the present invention.

First, in the process step shown in FIG. 1A, n-InP layer 2, active layer 3, p-InP layer 4 and p-InGaAsP layer 5 are stacked by vapor phase epitaxy in this order over an n-InP substrate 1. It should be noted that the active layer 3 is made up of multiple layers. Specifically, the active layer 3 consists of two InGaAsP barrier layers 6 and an InGaAsP well layer 7 interposed therebetween.

Next, an $SiO_2$ film 8 is deposited on the p-InGaAsP layer 5 (with a band gap $\lambda g=1.1$ $\mu m$). A plasma CVD process is used in this embodiment, but any other known process such as thermal CVD may also be used. The $SiO_2$ film 8 is formed by a plasma CVD or thermal CVD process, for instance. Therefore, an uppermost part of the p-InGaAsP layer 5 is altered into a degraded layer 9a due to damage caused by plasma or heat.

Figure 1B:
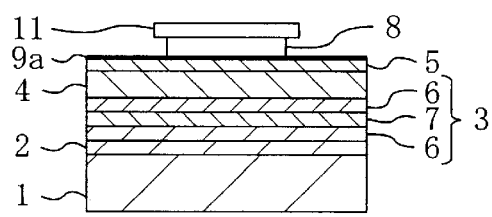

The next step is forming a photoresist film 11 patterned by a photolithography process as shown in FIG. 1B. Then, the $SiO_2$ film 8 is etched using the photoresist film 11 as a mask, thereby patterning the $SiO_2$ film 8 into stripes extending in the [011] direction. In this case, the $SiO_2$ film 8 is patterned by wet etching using hydrofluoric acid. Although the $SiO_2$ film 8 is used as a mask in the subsequent etching process, a silicon nitride ($Si_3N_4$) film may also be used as a mask in the same process after patterning the $Si_3N_4$ film into stripes extending in the [011] direction.

Figure 1C:
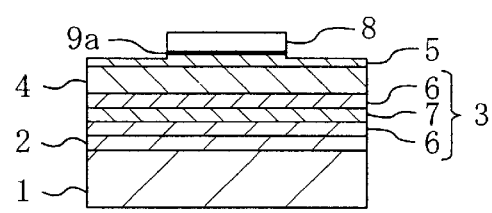

Thereafter, the photoresist film 11 is stripped in the process step shown in FIG. 1C. Then, the p-InGaAsP layer 5 is etched with an etchant containing saturated bromine water. In this manner, part of the degraded layer 9a in the uppermost part of p-InGaAsP layer 5 is removed, and the exposed surface of the p-InGaAsP layer 5 is cleaned.

The etchant containing saturated bromine water exhibits no selectivity because the etchant is not affected by the composition of InGaAsP. Therefore, the degraded part of the p-InGaAsP layer 5, no matter whether it is a damaged layer, oxide layer or reactant layer, can be etched uniformly with good reproducibility. Also, the etchant containing saturated bromine water realizes a very high etch rate. Therefore, if etching should be performed for a short period of time, the degraded layer 9a and p-InGaAsP layer 5 are etched away at almost the same rates. As a result, the p-InGaAsP layer 5 can have the composition of its uppermost part restored. In this embodiment, an etchant containing saturated bromine water is used. Alternatively any other etchant, not being affected by the composition of InGaAsP, exhibiting no selectivity as, and realizing an etch rate approximately equal to that of the etchant containing saturated bromine water, may also be used. For example, an etchant containing halogen (or a $Br_2/CH_3OH$ mixture or hydrogen bromide) or a mixture of sulfuric acid, hydrogen peroxide and water (which will be herein called $H_2SO_4/H_2O_2/H_2O$ mixture) may also be used.

This etching process just needs to be performed to the depth that the degraded layer 9a reaches in the p-InGaAsP layer 5. Specifically, the etching process is preferably performed to a depth between about 50 nm and about 200 nm.

Figure 1D:
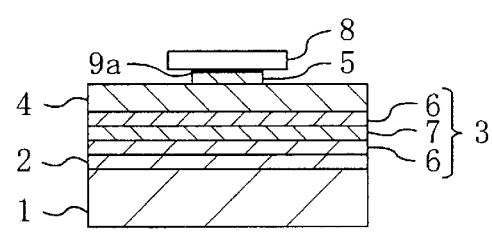

Next, in the process step shown in FIG. 1D, only the remaining part of the p-InGaAsP layer 5 is selectively removed with an $H_2SO_4/H_2O_2/H_2O$ mixture. The $H_2SO_4/H_2O_2/H_2O$ mixture etches the p-InGaAsP layer 5 at a rate lower than the etchant used in the process step shown in FIG. 1C. The degraded layer 9a has already been removed in the process step shown in FIG. 1C and therefore the remaining part of the p-InGaAsP layer 5 is removed at a uniform etch rate. Thus, no parts of the p-InGaAsP layer 5 are left on the exposed part of the p-InP layer 4.

Figure 1E:
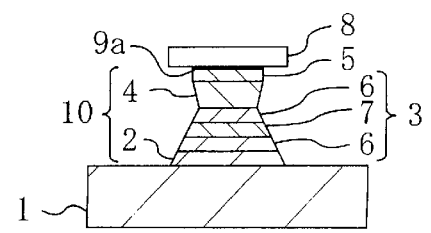

Then, in the process step shown in FIG. 1E, the p-InP layer 4 and the underlying layers are removed by an $HCl/H_2O_2$ mixture using the p-InGaAsP layer 5 as a mask until the p-InP substrate 1 has part of its surface exposed. As a result, a striped active layer 10 for a semiconductor laser chip is formed. It should be noted that a $Br_2/CH_3OH$ mixture or a mixture containing hydrogen bromide water may also be used instead of the $HCl/H_2O_2$ mixture.

Figure 8:
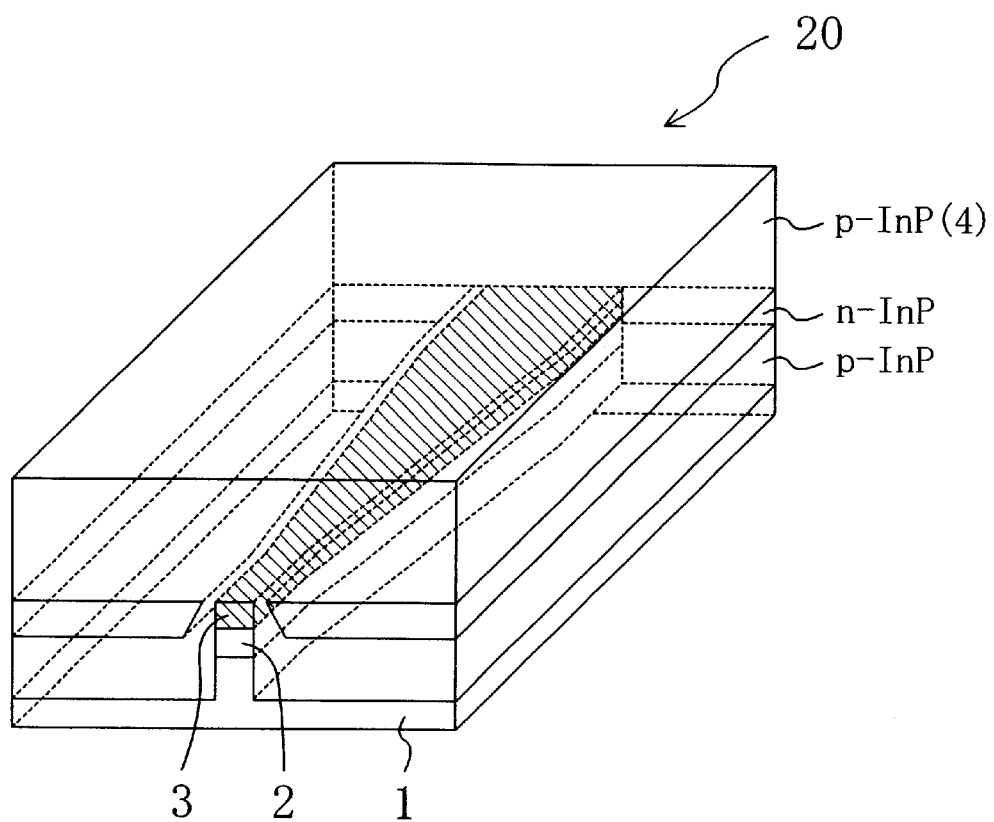
FIG. 8 is a perspective view illustrating a semiconductor laser diode.

Using the semiconductor laser chip with the striped active layer 10 that has been formed by above process steps, a semiconductor laser diode 20 as shown in FIG. 8 is fabricated by the methods disclosed in Japanese Laid-Open Publication No. 8-51255 and PCT International Patent Publication No. WO97/24787.

As described above, etching of the p-InGaAsP layer 5 is performed at two steps according to this embodiment. In the first etching process step, an etchant, not being affected by the composition of InGaAsP, and exhibiting no selectivity, is used. Therefore, the p-InGaAsP layer 5 can be etched uniformly with good reproducibility, no matter how the degraded layer 9a was formed. Also, by using such an etchant that realizes a very high etch rate, it is possible to remove the degraded layer 9a and the p-InGaAsP layer 5 at almost the same etch rates. Thus, the p-InGaAsP layer 5 can have the composition of its uppermost part restored. In the second etching process step on the p-InGaAsP layer 5, there is no need to etch the degraded layer 9a anymore. Therefore, etching of the p-InGaAsP layer 5 and the underlying layers can be started at almost the same time everywhere on the substrate. That is to say, the variation in etch rate on the same substrate or among substrates can be much reduced. Consequently, even though an isotropic wet etching process is performed, the compound semiconductor layer is much less likely to be etched horizontally at variable rates. In other words, the variation in the width of the striped active layer 10 can also be minimized on the same substrate or among substrates.

Embodiment 2

FIGS. 2A through 2F schematically illustrate cross-sectional structures corresponding to respective steps of a process of fabricating a semiconductor laser chip according to a second embodiment of the present invention.

Figure 2A:
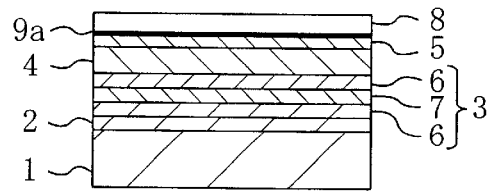
FIGS. 2A through 2F schematically illustrate cross-sectional structures corresponding to respective steps of a process of fabricating a semiconductor laser chip according to a second embodiment of the present invention.

First, in the process step shown in FIG. 2A, n-InP layer 2, active layer 3, p-InP layer 4 and p-InGaASP layer 5 are stacked by vapor phase epitaxy in this order over an n-InP substrate 1 as in the first embodiment. The active layer 3 is made up of multiple layers. Specifically, the active layer 3 consists of two InGaAsP barrier layers 6 and an InGaAsP well layer 7 interposed therebetween.

Next, an $SiO_2$ film 8 is deposited on the p-InGaAsP layer 5 (with a band gap λg=1.1 μm). A plasma CVD process is used in this embodiment, but any other known process such as thermal CVD may also be used. The $SiO_2$ film 8 is formed by a plasma CVD or thermal CVD process, for instance. Therefore, an uppermost part of the p-InGaAsP layer 5 is altered into a degraded layer 9a due to damage caused by plasma or heat.

Figure 2B:
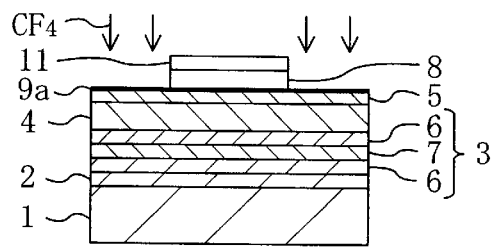

The next step is forming a photoresist film 11 patterned by a photolithography process as shown in FIG. 2B. Then, the $SiO_2$ film 8 is etched using the photoresist film 11 as a mask, thereby patterning the $SiO_2$ film 8 into stripes extending in the [011] direction. In this case, reactive ion etching (RIE), by which the $SiO_2$ film 8 can be patterned more precisely than wet etching, is performed using $CF_4$ gas. Although the $SiO_2$ film 8 is used as a mask in the subsequent etching process, a silicon nitride ($Si_3N_4$) film may also be used as a mask in the same process after patterning the $Si_3N_4$ film into stripes extending in the [011] direction.

Figure 2C:
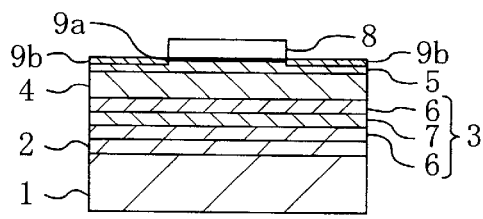

Thereafter, the photoresist film 11 is stripped in the process step shown in FIG. 2C. In this case, part of the surface of the p-InGaAsP layer 5 has been exposed. And the uppermost part of the p-InGaAsP layer 5 under the exposed surface, i.e., the degraded layer 9a, changes into a degraded layer 9b as a result of the RIE using $CF_4$ gas.

The degraded layer 9b is a damaged layer, or reactant layer or a mixture thereof and includes the degraded layer 9a. As used herein, the damaged layer has a composition deviated from the stoichiometric composition of InGaAsP. The oxide layer is formed through the reaction of constituent elements in InGaAsP with oxygen within an ambient. And the reactant layer is formed through the reaction of the constituent elements in InGaAsP with an etching gas. For example, where $CF_4$ gas is used as the etching gas, the reactant layer is made of a fluoride. These damaged, oxide and reactant layers appear in any of various combinations depending on the conditions of the RIE. That is to say, sometimes just one of the damaged, oxide and reactant layers may appear and sometimes the mixture thereof may be formed.

Figure 2D:
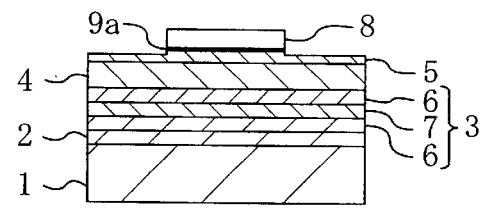

Thereafter, in the process step shown in FIG. 2D, the p-InGaAsP layer 5 is etched along with the degraded layer 9b using an etchant containing saturated bromine water. In this manner, the exposed surface of the p-InGaAsP layer 5 is cleaned (i.e., from which the degraded layer 9b has been eliminated). In this case, the etchant containing saturated bromine water is used. This is because the etchant, not being affected by the composition of InGaAsP, exhibits no selectivity as in the first embodiment. Therefore, the p-InGaAsP layer 5 with the degraded layer 9b can be etched uniformly with good reproducibility, no matter how the degraded layer 9b was formed. It is also because the etchant realizes a very high etch rate. For that reason, if etching should be performed for a short period of time, the degraded layer 9b and the p-InGaAsP layer 5 can be removed at almost the same etch rates. Thus, the p-InGaAsP layer 5 can have the composition of its uppermost part restored. Any other etchant exhibiting almost the same characteristics may be used instead of the etchant containing saturated bromine water used in this embodiment. For example, an etchant containing halogen (or a $Br_2/CH_3OH$ mixture or hydrogen bromide) or an $H_2SO_4/H_2O_2/H_2O$ mixture may also be used.

Figure 2E:
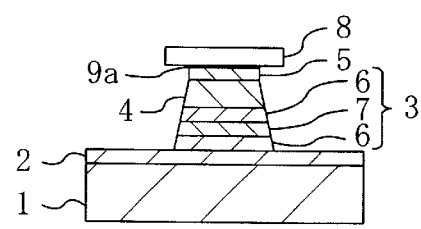

Next, in the process step shown in FIG. 2E, the p-InGaAsP layer 5 that has exposed part of its surface after the degraded layer 9b has been removed thereon, p-InP layer 4, and active layer 3 are etched with an $HCl/H_2O_2$ mixture, thereby exposing part of the surface of the n-InP layer 2. The $HCl/H_2O_2$ mixture realizes an etch rate lower than the etchant used in the process step shown in FIG. 2D. Instead of the $HCl/H_2O_2$ mixture, a mixture prepared to realize an etch rate lower than the etchant used in the process step shown in FIG. 2D may also be used. For example, a $Br_2/CH_3OH$ mixture or a mixture containing hydrogen bromide may be used.

Figure 2F:
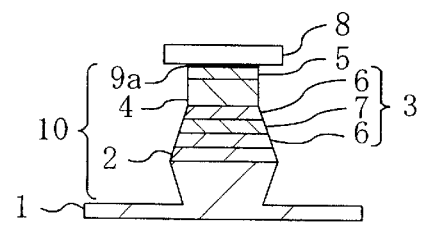

Then, in the process step shown in FIG. 2F, a striped active layer 10 for a semiconductor laser chip is formed by partially etching not only the n-InP layer 2 but also the n-InP substrate 1 to a certain depth with an HCl/phosphoric acid mixture.

Using the semiconductor laser chip with the striped active layer 10 that has been formed by above process steps, the semiconductor laser diode 20 as shown in FIG. 8 is fabricated by the methods disclosed in Japanese Laid-Open Publication No. 8-51255 and PCT International Patent Publication No. WO97/24787.

According to this embodiment, etching of the p-InGaAsP layer 5 is performed at two steps as in the first embodiment. In the first etching process step, an etchant, not being affected by the composition of InGaAsP, exhibiting no selectivity and realizing a very high etch rate, is used. Therefore, the degraded layer 9b and the p-InGaAsP layer 5 can be removed at almost the same etch rates. Thus, the p-InGaAsP layer 5 can have the composition of its upper-most part restored. For that reason, the variation in etch rate on the same substrate or among substrates can be much reduced in the second etching process step on the p-InGaAsP layer 5. In other words, by removing the degraded layer 9b before the second etching process, the etch rate becomes almost uniform on the same substrate or among substrates. As a result, the width of the striped active layer 10 can be almost uniformized on the same substrate. Further, even though any other substrate is used, the uniformity in width of the striped active layer 10 can also be reproduced.

The data obtained by electron spectroscopy for chemical analysis (ESCA) on the surface of the p-InGaAsP layer 5 is shown in the FIGS. 3 through 5E. Specifically, the data is about the surface of the p-InGaAsP layer 5, which has not yet been etched in the process step shown in FIG. 2D after the RIE using $CF_4$ gas. The data is also about the surface of the p-InGaAsP layer 5, which has been etched in the same step after the RIE using $CF_4$ gas. In the drawings and Table 1, the data of these two types are labeled as "Not etched yet after RIE" and "Etched after RIE", respectively.

Figure 3:
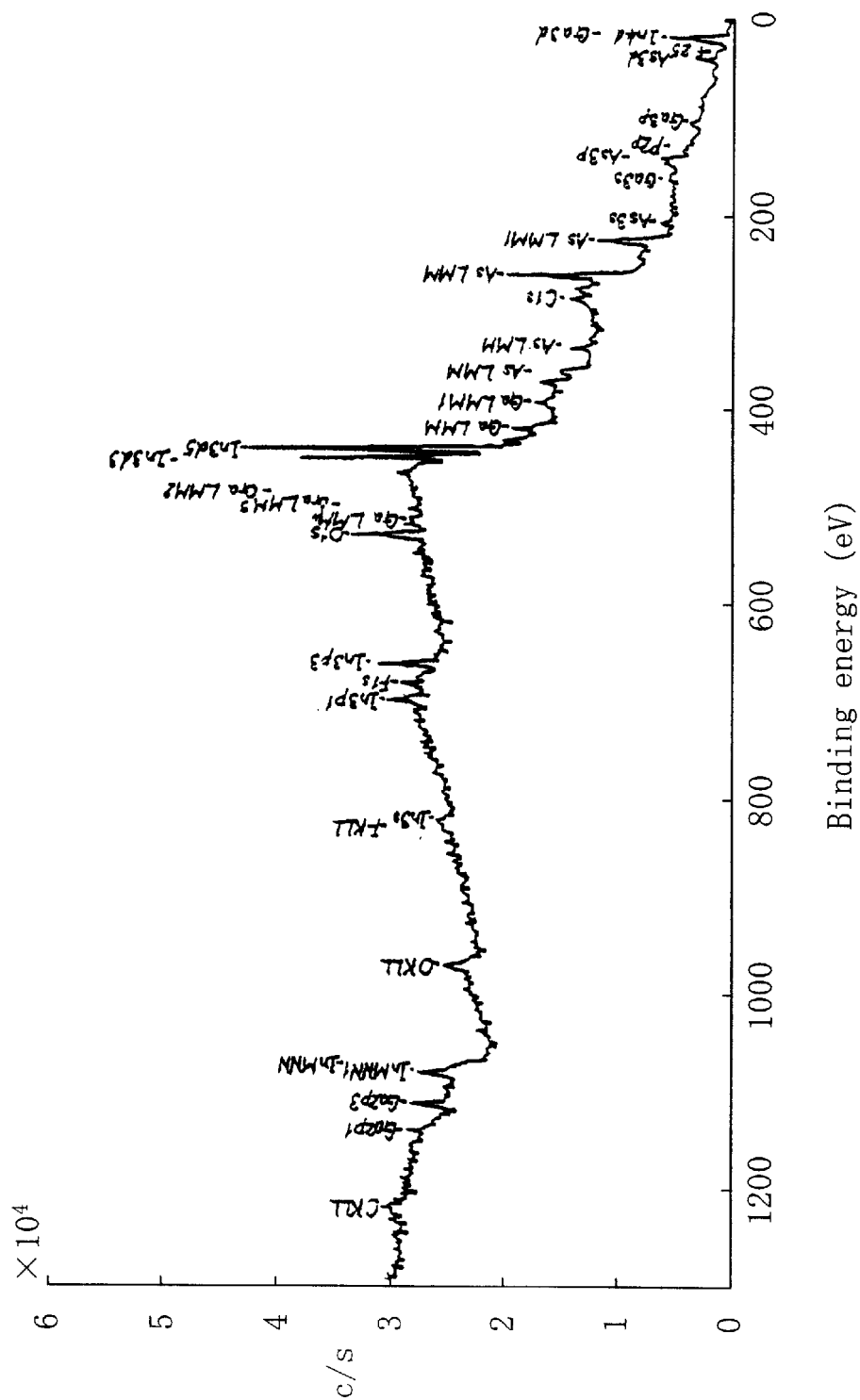
FIG. 3 is a wide scan spectrum chart illustrating the results obtained by electron spectroscopy for chemical analysis (ESCA) on the surface of a p-InGaAsP layer, which has not yet been etched after a reactive ion etching (RIE) process.
Figure 4:
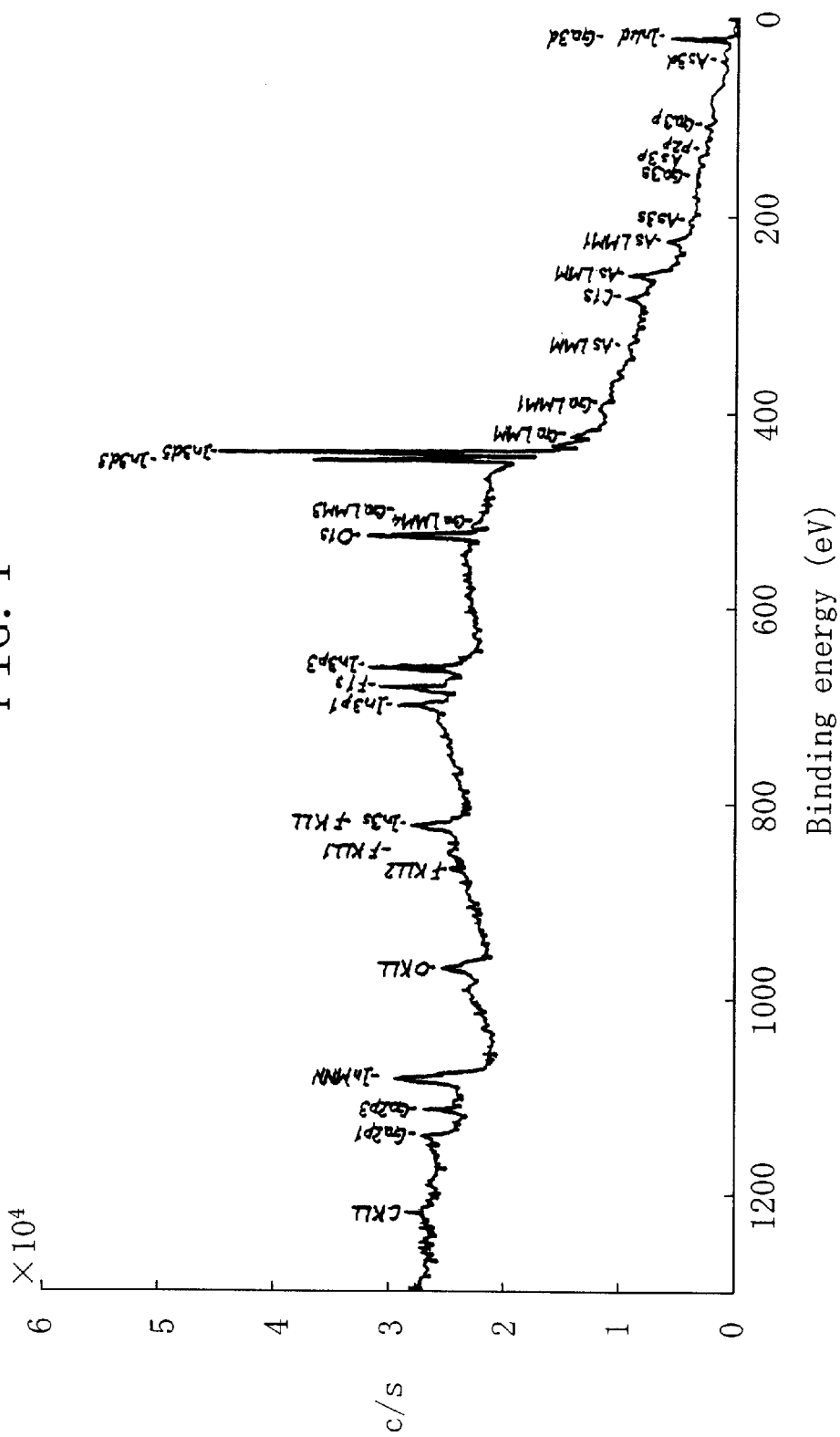
FIG. 4 is a wide scan spectrum chart illustrating the results obtained by ESCA on the surface of the p-InGaAsP layer, which has been etched with an etchant containing saturated bromine water after the RIE.
Figure 5A:
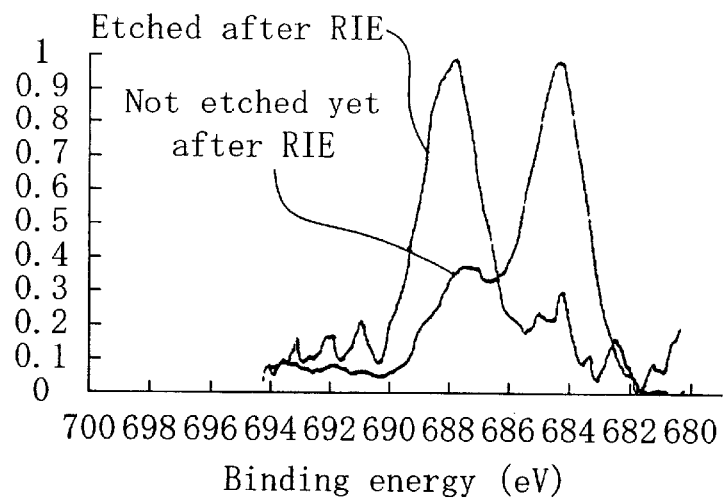
FIGS. 5A through 5E are charts illustrating the spectra of F, P, Ga, As and In elements measured by ESCA, respectively.
Figure 5B:
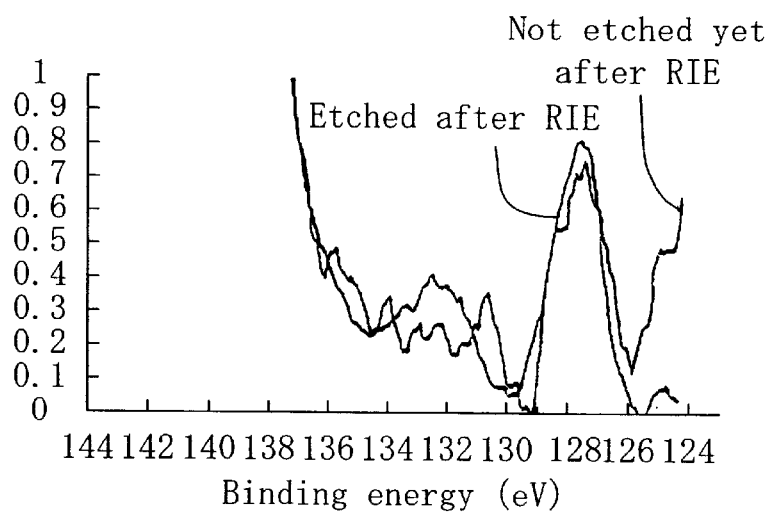
Figure 5C:
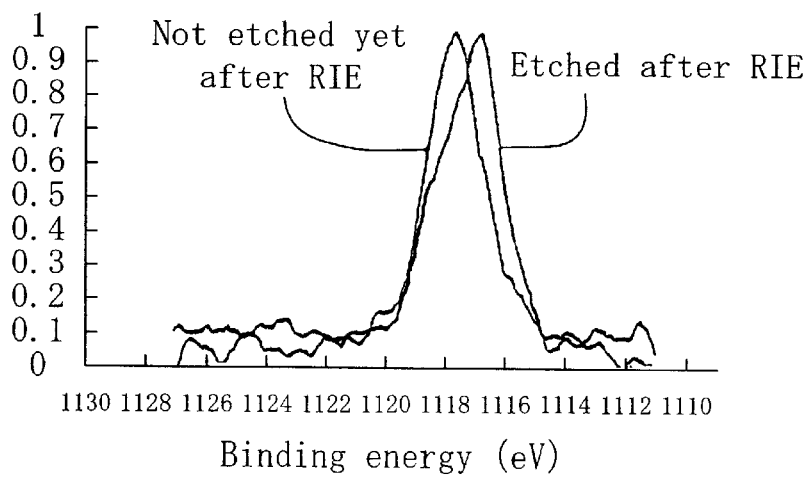
Figure 5D:
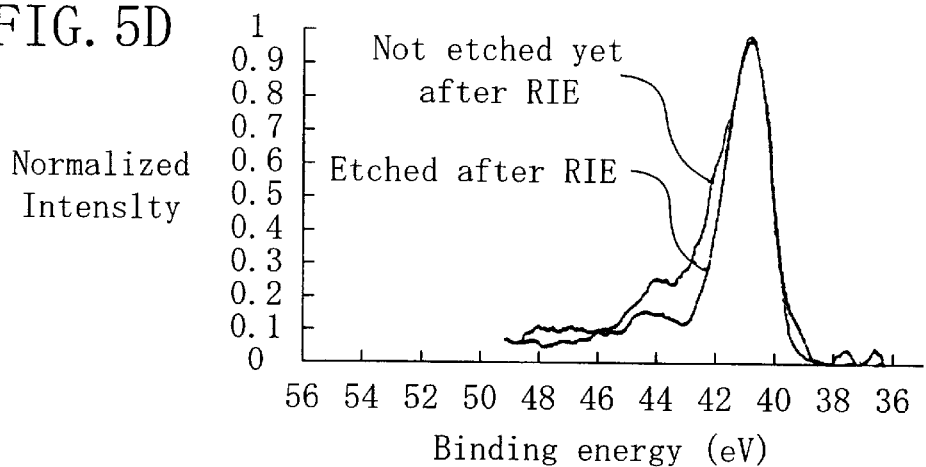
Figure 5E:
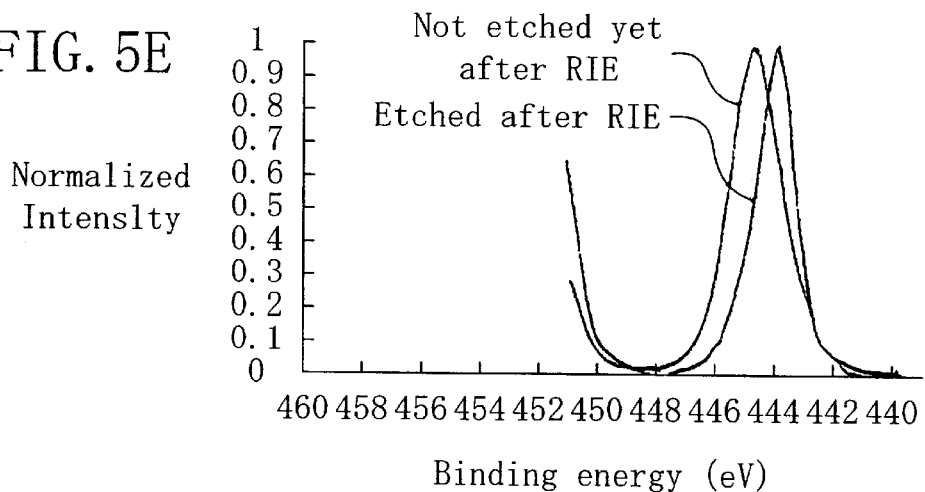

FIGS. 3 and 4 illustrate wide scan spectrum charts showing the results obtained by the ESCA on the surface of the p-InGaAsP layer in the "Not etched yet after RIE" and "Etched after RIE" states, respectively.

FIGS. 5A through 5E illustrate the spectra of fluorine (F), P, Ga, As and In elements, respectively, under the surface of the p-InGaAsP layer in the "Not etched yet after RIE" and "Etched after RIE" states.

Hereinafter, the quantitative values of these elements obtained from the data shown in FIGS. 3 through 5E are shown on the following table 1.

TABLE 1

|  | C | O | F | P | Ga | As | In |
|---|---|---|---|---|---|---|---|
| Not etched yet after RIE | 16 | 36 | 23 | 1 | 3 | 4 | 17 |
| Etched after RIE | 22 | 30 | 7 | 7 | 4 | 13 | 17 |

(unit: atomic %)

Just after the p-InGaAsP layer 5 has been etched by the RIE, the fractions of As and P in the composition of the p-InGaAsP layer 5 have decreased considerably from their original fractions as shown in Table 1. That is to say, the p-InGaAsP layer 5 at that point has a composition deviated from its stoichiometry in its uppermost part under the surface. It can also be seen that an oxide layer made up of gallium oxide, arsenic oxide and indium hydroxide and a fluoride layer have been formed. In other words, the uppermost part of the p-InGaAsP layer 5 has been altered into the degraded layer 9b with a composition deviated from its stoichiometry.

In contrast, after the uppermost part of the p-InGaAsP layer 5 has been etched with an etchant containing saturated bromine water to a depth of about 100 nm next to the RIE, that part is not so deviated from its stoichiometry as the "Not etched yet after RIE" state as can be seen in Table 1. Gallium oxide, arsenic oxide, indium oxide and just a small amount of fluoride oxide still exist in the uppermost part of the p-InGaAsP layer 5 at this point. However, the composition of the InGaAsP layer 5 has almost been restored as a result of etching the degraded layer 9b.

From these results obtained by ESCA, it can be seen that the p-InGaASP layer 5 with its stoichiometric composition has its surface exposed by removing the degraded layer 9b with an etchant containing saturated bromine water.

Embodiment 3

FIGS. 7A through 7E schematically illustrate cross-sectional structures corresponding to respective steps of a process of fabricating a semiconductor laser chip according to a third embodiment of the present invention.

Figure 7A:
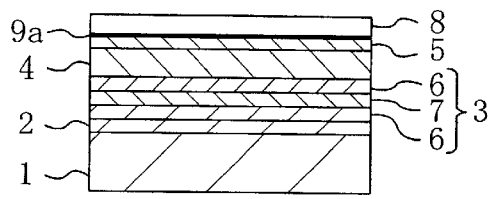
FIGS. 7A through 7E schematically illustrate cross-sectional structures corresponding to respective steps of a process of fabricating a semiconductor laser chip according to a third embodiment of the present invention.

First, in the process step shown in FIG. 7A, n-InP layer 2, active layer 3, p-InP layer 4 and p-InGaAsP layer 5 are stacked by vapor phase epitaxy in this order over an n-InP substrate 1 as in the foregoing embodiments. The active layer 3 is made up of multiple layers. Specifically, the active layer 3 consists of two InGaAsP barrier layers 6 and an InGaAsP well layer 7 interposed therebetween.

Next, an $SiO_2$ film 8 is deposited on the p-InGaAsP layer 5 (with a band gap $\lambda.g=1.1$ $\mu$m). A plasma CVD process is used in this embodiment, but any other known process such as thermal CVD may also be used. The $SiO_2$ film 8 is formed by a plasma CVD or thermal CVD process, for instance. Therefore, an uppermost part of the p-InGaAsP layer 5 is altered into a degraded layer 9a due to damage caused by plasma or heat.

Figure 7B:
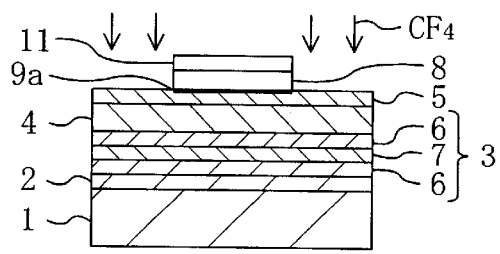

The next step is forming a photoresist film 11 patterned by a photolithography process as shown in FIG. 7B. Then, the $SiO_2$ film 8 is etched by RIE with $CF_4$ gas using the photoresist film 11 as a mask, thereby patterning the $SiO_2$ film 8 into stripes extending in the [011] direction. Although the $SiO_2$ film 8 is used as a mask in the subsequent etching process, a silicon nitride ($Si_3N_4$) film may also be used as a mask in the same process after patterning the $Si_3N_4$ film into stripes extending in the [011] direction.

In this embodiment, dry etching using $CF_4$ gas is performed (i.e., a chemical etching process is performed), but a physical etching process such as ion sputtering may also be performed. Almost the same degraded layer is formed as a result of the physical etching process.

Figure 7C:
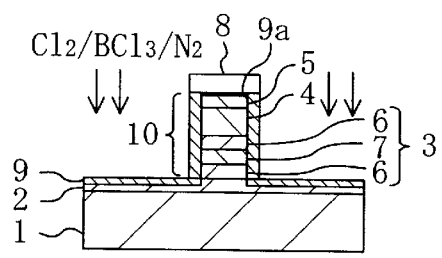

Next, in the process step shown in FIG. 7C, the p-InGaAsP layer 5, p-InP layer 4 and active layer 3 are dry-etched using a mixture of chlorine ($Cl_2$) gas, boron trichloride ($BCl_3$) gas and nitrogen ($N_2$) gas, thereby exposing parts of the surface of the n-InP layer 2. In this case, dry etching is performed to prevent the active layer 3 from being tapered as in the foregoing embodiments, in each of which wet etching is performed, and thereby pattern the p-InGaAsP layer 5 and the underlying layers more precisely. By this dry etching process, a striped active layer 10 for a semiconductor laser chip is formed. At this point, the uppermost part of the exposed n-InP layer 2 and the sides of the striped active layer 10 have been altered into the degraded layer 9b as a result of the dry etching process.

Thereafter, if the n-InP layer 2 is etched using an etchant containing hydrochloric acid, the etch rate varies due to the existence of the degraded layer 9b. As a result, the width of the striped active layer 10 cannot be uniform anymore.

Figure 7D:
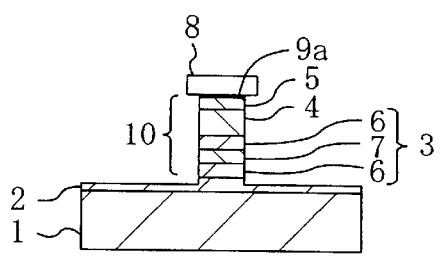

To solve this problem, an etchant, not being affected by the composition of InGaAsP, exhibiting no selectivity and realizing a very high etch rate, is used (e.g., a $Br_2/CH_3OH$ mixture is used in this embodiment). By using such an etchant, the degraded layer 9b, the uppermost part of the p-InP layer 2 and the sides of the striped active layer 10 are etched as shown in FIG. 7D. In this manner, the exposed surface of the p-InP layer 2 and the sides of the striped active layer 10 are cleaned (i.e., from which the degraded layer 9b has been eliminated).

In this embodiment, the degraded layer is formed on parts of the laser chip structure being etched by the RIE using a mixture of chlorine, boron trichloride and nitrogen gases. Such a degraded layer might not be formed over a wide range depending on the conditions of the dry etching process and another type of degraded layer made up of chloride, nitride and boride might be formed instead. This type of degraded layer can also be etched away using the $Br_2/CH_3OH$ mixture.

Although the $Br_2/CH_3OH$ mixture is used to remove the degraded layer 9b in this embodiment, saturated bromine water, $HCl/H_2O_2$ mixture, $H_2SO_4/H_2O_2/H_2O$ mixture or etchant containing saturated bromine water may also be used, for example.

Figure 7E:
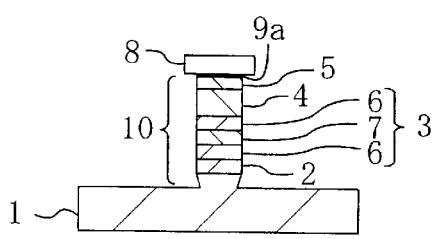

The next step is etching not only part of the exposed n-InP layer 2 but also part of the n-InP substrate 1 to a certain depth using an HCl/phosphoric acid mixture as shown in FIG. 7E. In this manner, the striped active layer 10 with a uniform height as measured from the surface of the substrate and a uniform width can be formed.

The HCl/phosphoric acid mixture is used in the etching process after the degraded layer 9b has been removed, but HCl/phosphoric acid/acetic acid mixture, HCl/acetic acid mixture or $HCl/H_2O_2$/acetic acid mixture may also be used.

Using the semiconductor laser chip with the striped active layer 10 that has been formed by above process steps, the semiconductor laser diode 20 as shown in FIG. 8 is fabricated by the methods disclosed in Japanese Laid-Open Publication No. 8-51255 and PCT International Patent Publication No. WO97/24787.

The degraded layer 9b and the sides of the striped active layer 10 can be removed at almost the same etch rates with an etchant, not being affected by the composition of In-InGaAsP, exhibiting no selectivity and realizing a very high etch rate as described above. Therefore, where the sides of the striped active layer 10 are cleaned, the width of the striped active layer 10 can be kept uniform on the same substrate and can be reproduced even on a different substrate.

What is claimed is:

1. A method for fabricating a semiconductor device with a compound semiconductor layer, the method comprising the steps of:

a) depositing a masking film on a first compound semiconductor layer formed on a semiconductor substrate;

b) patterning the masking film so that the film has an opening;

c) etching away at least an uppermost part of the first compound semiconductor layer which part is located inside the opening and includes a degraded layer formed in the step a) or b), using a first etchant and the masking film; and d) patterning the first compound semiconductor layer by etching away another part of the first compound semiconductor layer using a second etchant and masking film, wherein said another part is located inside the opening and does not include the uppermost part with the degraded layer, wherein the second etchant allows for etching the first compound semiconductor layer at a rate lower than a rate realized by the first etchant, wherein the degraded layer includes at least one of: a damaged layer that has a composition deviated from a stoichiometric composition of elements in the first compound semiconductor layer; an oxide layer of the first compound semiconductor layer; and a reactant layer formed through a reaction of the first compound semiconductor layer with a reactive gas for use in the dry etching process, wherein in the step a), an uppermost part of the substrate is a second compound semiconductor layer, and wherein the method further comprises the step of patterning the second semiconductor layer using a remaining part of the first semiconductor layer as a mask after the first layer has been patterned in the step d).

2. The method of claim 1, wherein in the step b), the masking film is patterned by a dry etching process.

3. The method of claim 1, wherein in the step b), the masking film is patterned by a dry etching process.

4. The method of claim 3, wherein the degraded layer includes at least one of: a damaged layer that has a composition deviated from a stoichiometric composition of elements in the first compound semiconductor layer; an oxide layer of the first compound semiconductor layer; and a reactant layer formed through a reaction of the first compound semiconductor layer with a reactive gas for use in the dry etching process.

5. A method for fabricating a semiconductor device with a compound semiconductor layer, the method comprising the steps of:

a) depositing a masking film on a compound semiconductor layer formed on a semiconductor substrate;

b) patterning the masking film so that the film has an opening;

c) removing a first part of the compound semiconductor layer to a point by a dry etching process using the masking film, the first part being located inside the opening; and d) etching away at least a second part of the compound semiconductor layer using a first etchant and the masking film, the second part including a degraded layer formed in the step c), wherein the degraded layer includes at least one of: a damaged layer that has a composition deviated from a stoichiometric composition of elements in the first compound semiconductor layer; an oxide layer of the first compound semiconductor layer; and a reactant layer formed through a reaction of the first compound semiconductor layer with a reactive gas for use in the dry etching process, wherein in the step a), the semiconductor layer is made up of first and second compound semiconductor layers that have been stacked in this order on the substrate, and wherein in the step c), the first part of the first semiconductor layer is removed, and wherein in the step d), at least the second parts of the first and second semiconductor layers are etched away using the first etchant and the masking film, and wherein the method further comprises the step of e) patterning the first semiconductor layer by removing a third part of the first semiconductor layer using a second etchant and the masking film, the third part being located inside the opening and not including the second part, the second etchant allowing for etching the first semiconductor layer at a rate lower than a rate realized by the first etchant.

6. A method for fabricating a semiconductor device with a compound semiconductor layer, the method comprising the steps of:

a) depositing a masking film on a first compound semiconductor layer formed on a semiconductor substrate;

b) patterning the masking film so that the film has an opening;

c) etching away at least an uppermost part of the first compound semiconductor layer, which part is located inside the opening and includes a degraded layer formed in the step a) or b), using a first etchant and the masking film; and d) patterning the first compound semiconductor layer by etching away another part of the first compound semiconductor layer using a second etchant and the masking film, wherein said another part is located inside the opening and does not include the uppermost part with the degraded layer, wherein the second etchant allows for etching the first compound semiconductor layer at a rate lower than a rate realized by the first etchant, wherein in the step a), an uppermost part of the substrate is a second compound semiconductor layer, and wherein the method further comprises the step of patterning the second compound semiconductor layer using a remaining part of the first compound semiconductor layer as a mask after the first compound semiconductor layer has been patterned in the step d).

7. The method of claim 1, wherein in the step b), the masking film is patterned by a dry etching process.

8. The method of claim 1, wherein the degraded layer includes at least one of: a damaged layer that has a composition deviated from a stoichiometric composition of elements in the first compound semiconductor layer; an oxide layer of the first compound semiconductor layer; and a reactant layer formed through a reaction of the first compound semiconductor layer with a reactive gas for use in the dry etching process.

9. A method for fabricating a semiconductor device with a compound semiconductor layer, the method comprising the steps of:

a) depositing a masking film on a compound semiconductor layer formed on a semiconductor substrate;

b) patterning the masking film so that the film has an opening;

c) removing a first part of the compound semiconductor layer to a point by a dry etching process using the masking film, the first part being located inside the opening; and d) etching away at least a second part of the compound semiconductor layer using a first etchant and the masking film, the second part including a degraded layer formed in the step c), wherein in the step a), the semiconductor layer is made up of first and second compound semiconductor layers that have been stacked in this order on the substrate, wherein in the step c), the first part of the first compound semiconductor layer is removed, wherein in the step d), at least the second parts of the first and second compound semiconductor layers are etched away using the first etchant and the masking film, and wherein the method further comprises the step of e) patterning the first compound semiconductor layer by removing a third part of the first compound semiconductor layer using a second etchant and the masking film, the third part being located inside the opening and not including the second part, the second etchant allowing for etching the first compound semiconductor layer at a rate lower than a rate realized by the first etchant.

* * * * *

UNITED STATES PATENT AND TRADEMARK OFFICE
CERTIFICATE OF CORRECTION

PATENT NO. : 6,613,679 B2
DATED : September 2, 2003
INVENTOR(S) : Toyoji Chino

It is certified that error appears in the above-identified patent and that said Letters Patent is hereby corrected as shown below:

<u>Column 10,</u>
Line 43, change "compound semiconductor layer which" to -- compound semiconductor layer, which --;

<u>Column 11,</u>
Lines 7-8, delete "3. The method of claim 1, wherein in the step b), the masking film is patterned by a dry etching process". and change all other Claim numbers accordingly;
Line 9, change "claim 3" to -- claim 2 --;

Signed and Sealed this

Eighteenth Day of May, 2004

JON W. DUDAS
*Acting Director of the United States Patent and Trademark Office*